United States Patent
Tseng et al.

(10) Patent No.: US 9,711,593 B2
(45) Date of Patent: Jul. 18, 2017

(54) DUMMY GATE FOR A HIGH VOLTAGE TRANSISTOR DEVICE

(75) Inventors: Hua-Chou Tseng, Hsinchu (TW); Meng-Wei Hsieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/397,465

(22) Filed: Feb. 15, 2012

(65) Prior Publication Data

US 2013/0161739 A1  Jun. 27, 2013

Related U.S. Application Data

(60) Provisional application No. 61/579,924, filed on Dec. 23, 2011.

(51) Int. Cl.

| | | |
|---|---|---|
| *H01L 29/66* | (2006.01) | |
| *H01L 29/06* | (2006.01) | |
| *H01L 29/40* | (2006.01) | |
| *H01L 29/78* | (2006.01) | |
| H01L 29/45 | (2006.01) | |
| H01L 29/49 | (2006.01) | |
| H01L 29/08 | (2006.01) | |
| H01L 29/10 | (2006.01) | |

(52) U.S. Cl.
CPC ...... *H01L 29/0646* (2013.01); *H01L 29/0634* (2013.01); *H01L 29/404* (2013.01); *H01L 29/66659* (2013.01); *H01L 29/7835* (2013.01); *H01L 29/0653* (2013.01); *H01L 29/0847* (2013.01); *H01L 29/1045* (2013.01); *H01L 29/456* (2013.01); *H01L 29/4933* (2013.01); *H01L 29/665* (2013.01)

(58) Field of Classification Search
CPC ............. H01L 29/0646; H01L 29/0653; H01L 29/402; H01L 29/456; H01L 29/66659
USPC .................................................. 257/331–344
See application file for complete search history.

(56) References Cited

U.S. PATENT DOCUMENTS

| | | | |
|---|---|---|---|
| 7,405,443 B1 * | 7/2008 | Zuniga et al. | 257/328 |
| 8,120,108 B2 * | 2/2012 | Pendharkar | 257/341 |
| 8,178,930 B2 | 5/2012 | Wang et al. | |

(Continued)

OTHER PUBLICATIONS

S. Wolf, "Silicon Processing", Lattice Press, 2000, vol. 1—Precess Technology, p. 377.*

(Continued)

*Primary Examiner* — John C Ingham
*Assistant Examiner* — Frederick B Hargrove
(74) *Attorney, Agent, or Firm* — Haynes and Boone, LLP

(57) ABSTRACT

A semiconductor device and methods for forming the same are provided. The semiconductor device includes a first doped region and a second, oppositely doped, region both formed in a substrate, a first gate formed overlying a portion of the first doped region and a portion of the second doped region, two or more second gates formed over the substrate overlying a different portion of the second doped region, one or more third doped regions in the second doped region disposed only between the two or more second gates such that the third doped region and the second doped region having opposite conductivity types, a source region in the first doped region, and a drain region in the second doped region disposed across the second gates from the first gate.

16 Claims, 13 Drawing Sheets

(56) References Cited

U.S. PATENT DOCUMENTS

| | | | |
|---|---|---|---|
| 2009/0261426 A1* | 10/2009 | Feilchenfeld | H01L 21/26513 257/408 |
| 2010/0102388 A1* | 4/2010 | Levin et al. | 257/343 |
| 2010/0237439 A1* | 9/2010 | Lee | H01L 29/42372 257/408 |
| 2010/0301403 A1* | 12/2010 | Min et al. | 257/316 |
| 2010/0301413 A1* | 12/2010 | You | 257/343 |
| 2011/0180870 A1* | 7/2011 | Pendharkar | 257/337 |
| 2011/0193161 A1* | 8/2011 | Zhu | H01L 29/402 257/343 |
| 2012/0211832 A1* | 8/2012 | Chu et al. | 257/335 |

OTHER PUBLICATIONS

S. Wolf, "Silicon Processing", Lattice Press, 2000, vol. 1—Process Technology, p. 377.*

* cited by examiner

US 9,711,593 B2

DUMMY GATE FOR A HIGH VOLTAGE TRANSISTOR DEVICE

CROSS-REFERENCE TO RELATED APPLICATIONS

The present application claims priority of U.S. Provisional Patent Application Ser. No. 61/579,924, filed on Dec. 23, 2011, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The constantly decreasing geometry size leads to challenges in fabricating high voltage semiconductor transistor devices. These high voltage (HV) transistor devices may need a sufficiently large voltage drop from a gate of the transistor device to a drain region of the transistor device. Traditionally, the large voltage drop has been accomplished by pushing the drain region away from the gate and source region, effectively lengthening the drift region between the gate and the drain. However, as transistor device sizes become smaller, it becomes impractical to lengthen the drift region. The drift region length affects various reliability characteristic such as hot carrier injection (HCI) and time dependent dielectric break down (TDDB). Hot carrier injection (HCI) is a phenomenon in solid-state electronic devices where an electron or a "hole" gains sufficient kinetic energy to overcome a potential barrier necessary to break an interface state. Since the charge carriers can become trapped in the gate dielectric of a metal-oxide semiconductor (MOS) transistor, the switching characteristics of the transistor can be permanently changed if the HCI is not sufficiently controlled. Time-dependent dielectric breakdown (TDDB) is a failure mechanism in MOS field effect transistors (MOSFETs), when the gate oxide breaks down because of formation of a conducting path through the gate oxide to substrate. This is due to an electron tunneling current, when MOSFETs are operated close to or beyond their specified operating voltages.

Therefore, while existing methods of fabricating high voltage transistors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
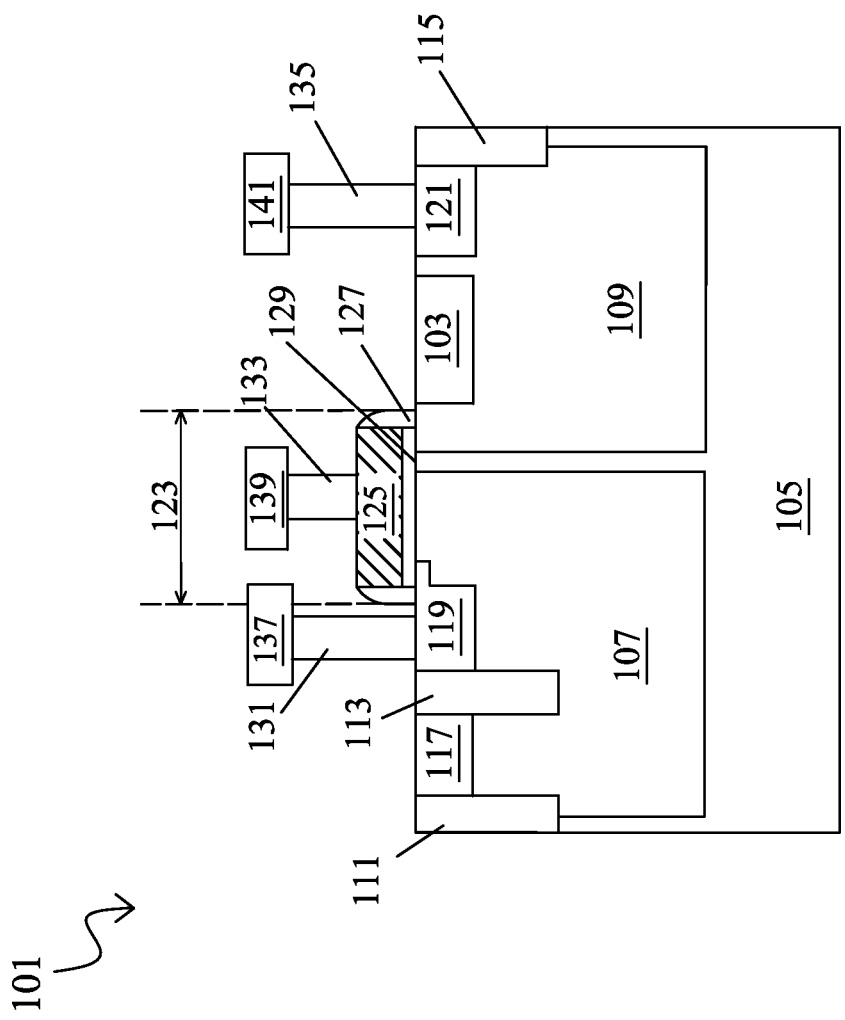
FIGS. 1A and 1B show cross-sectional views of two types of HV MOS transistor devices.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In order to solve the issues of hot carrier injection (HCI) and time dependent dielectric breakdown (TDDB), a counter doped region in the drift region has been used. FIG. 1A shows a HV MOSFET 101 that includes a counter doped region 103. Using an NMOS as an example, a p-well 107 and a n-well 109 are formed in substrate 105, which usually is a p-type silicon substrate. Shallow trench isolation (STI) features 111, 113, and 115 are formed in and around the p-well 107 and n-well 109 as shown. An additional p-well 117 is formed between the STI features 111 and 113 as a substrate pickup. The source region 119 is formed between STI 113 and gate structure 123, which includes gate electrode 125, spacers 127, and gate dielectric 129. A lightly doped portion of the source region 119 is formed under the gate structure 123. A drain region 121 is formed between the counter doped region 103 and the STI 115. Each of the source 119, gate 123, and drain 121 are connected via metal contacts 131, 133, and 135 to the first interconnect metals 137, 139, and 141. Note that for a PMOS, all of the doping would be changed to an opposite conductivity type and a deep n-well would be added below the p-well and the n-well to segregate the p-type substrate from the doped wells.

As shown in FIG. 1A, the counter doped region 103 is formed close to the gate structure between the source 119 and drain 121. While the counter doped region 103 decreases HCI and improves TDDB, its proximity to the gate structure increases the on-state resistance ($R_{on}$) and decreases the knee region of the operating $I_d$-$V_d$ curve when high gate voltage is applied. The dopant from the counter doped region 103, if laterally diffused or applied too close to the gate, also increases higher junction leakage current during off state.

Figure 1B:
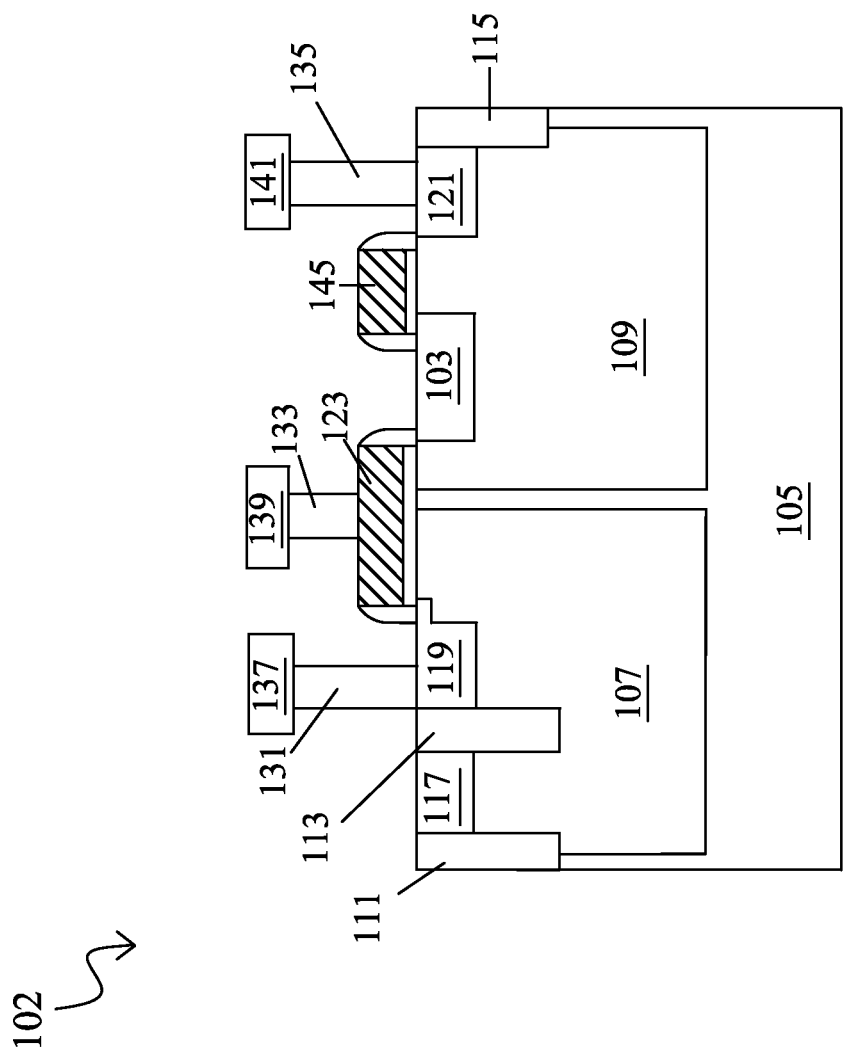

An improved HV MOSFET 102 is shown in FIG. 1B. The main difference between HVMOSFET 101 of FIG. 1A and improved HVMOSFET 102 of FIG. 1B is the use of a dummy gate structure 145 to define a width of the counter doped region 103. A dummy gate structure 145 can be patterned and formed at the same time as the gate structure 124. The spacers between the two gate structures allow the use of a self-aligned implant process to form the counter doped region 103. The lateral diffusion and the close application of the dopant issues are reduced or resolved in this embodiment. However, the on-state resistance ($R_{on}$) and $I_d$-$V_d$ curve knee region issues still persist.

Figure 2:
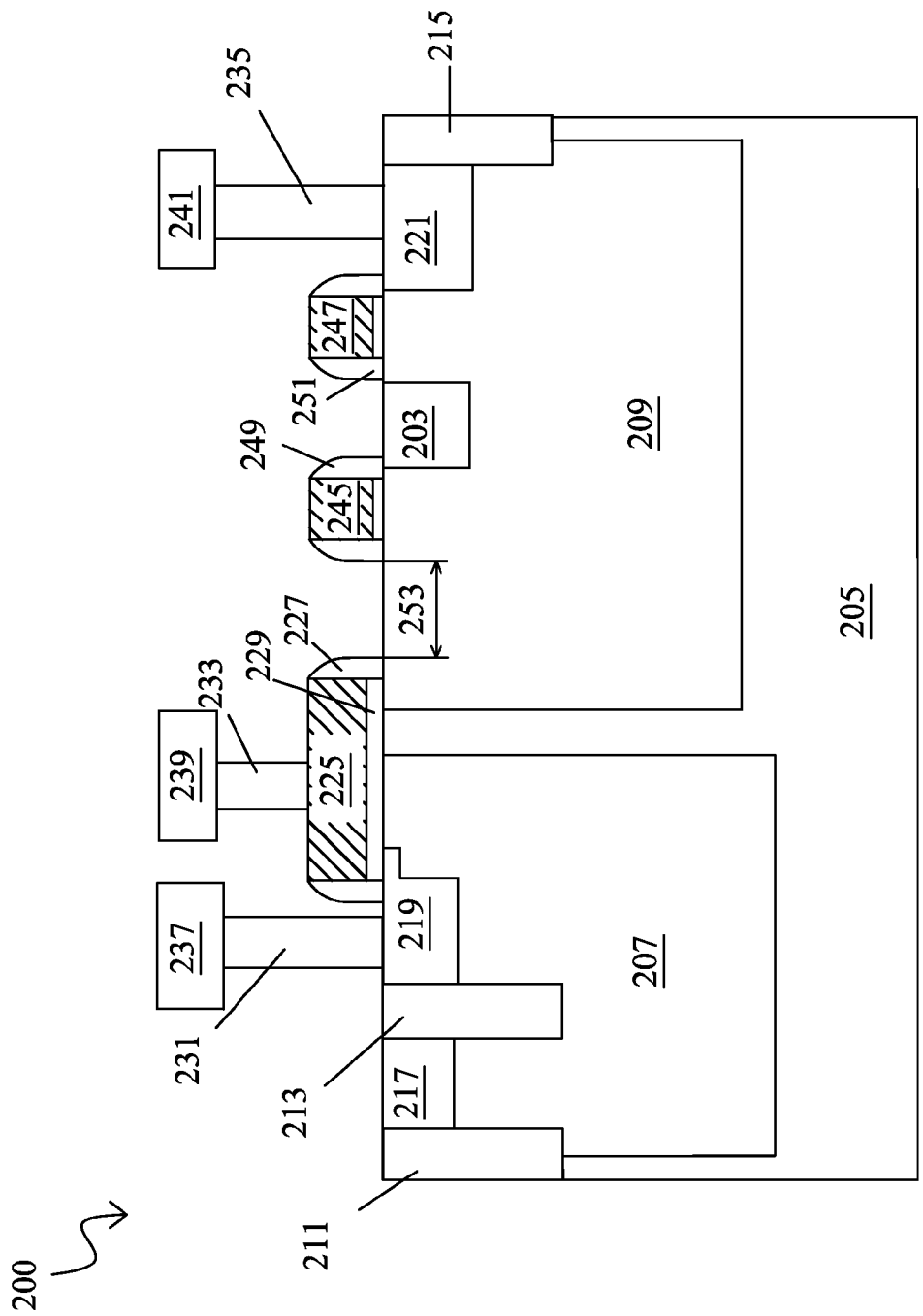
FIG. 2 shows a cross-sectional view of a HV MOS transistor according to various embodiments of the present disclosure.

FIG. 2 shows an HVMOSFET 200 in accordance with various embodiments of the present disclosure. HV MOSFET 200 includes a counter doped region 203 between two dummy gate structures, each having a gate electrode, 245 and 247 respectively, over a gate dielectric, and spacers around the gate electrode and dielectric, 249 and 251 respectively. Using an NMOS as an example, a p-well 207 and a n-well 209 are formed in substrate 205, which usually is a p-type silicon substrate. Shallow trench isolation (STI) features 211, 213, and 215 are formed in and around the p-well 207 and n-well 209 as shown. An additional p-well 217 is formed between the STI features 211 and 213 as a substrate pickup. The source region 219 is formed between STI 213 and gate structure, which includes gate electrode 225, spacers 227, and gate dielectric 229. A lightly doped portion of the source region 219 is formed under a portion of the gate structure. A drain region 221 is formed between the counter doped region 203 and the STI 215. Each of the source 219, gate 223, and drain 221 are connected via metal contacts 231, 233, and 235 to the first interconnect metals 237, 239, and 241.

The counter doped region 203 is formed in the drift region between the gate structure and the drain. The counter doped region 203 is separated from the drain region by one dummy gate. The counter doped region 203 is separated from the gate structure by one dummy gate and a portion of the drift region with a length 253 between the dummy gate and the device gate. The counter doped region 203 region also decreases HCI and improves TDDB, but it is not so close to the gate structure that the on-state resistance increases significantly. Further, the knee region of the operating $I_d$-$V_d$ curve when high gate voltage is applied is better formed, which increases the operating voltage window for the device. The dopant from the counter doped region 203 is unlikely to laterally diffuse because of the longer distance between the counter doped region 203 and the gate structure, which decreases the junction leakage current during off state.

Figure 3:
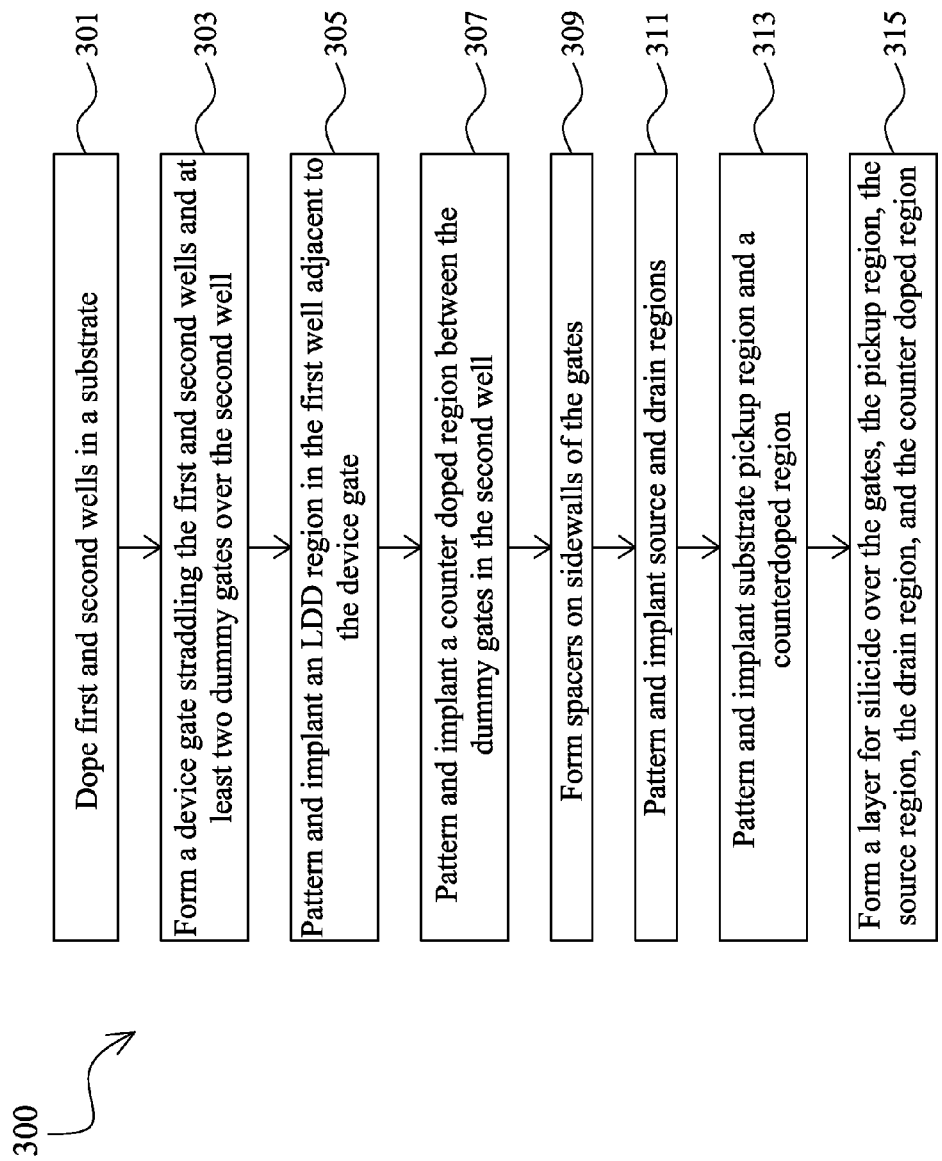
FIG. 3 is a flowchart illustrating a method of forming a semiconductor device according to various aspects of the present disclosure.

The HV MOSFET 200 of FIG. 2 can be made using existing CMOS manufacturing operations used for low voltage transistors, without changing any process parameters. The methods for forming the HV MOSFET 200 make use of existing manufacturing processes by applying some of them in different areas of the device. Thus, only the photolithography mask need be changed. FIG. 3 is a flowchart of a method 300 for fabricating a semiconductor device in accordance with various embodiments of the present disclosure. The method 300 is explained with FIGS. 4A, 4B, 5, 6A, 6B, 7, 8, and 9 that show diagrammatic fragmentary cross-sectional side views. In summary, the method 300 begins with block 301 in which first and second oppositely-doped wells are formed in a substrate. The method continues with block 303 in which a device gate and at least two dummy gates are formed over the substrate. The device gate is formed over the first and second wells. The dummy gates are formed over the second well. The first and second wells may be separated by a gap called a native region. The method continues with block 305 in which a protective mask is formed to pattern an opening for a lightly doped source region in the first well adjacent to the device gate, and then implant the lightly doped source region. In some embodiments, the method continues with block 307 where a counter doped region between the dummy gates are patterned and implanted when the lightly doped region is formed for the complementary MOSFET. In other words, the block 307 for a PMOS is formed when a lightly doped source region is formed for an NMOS, and vice versa. In other embodiments, the counter doped region is implanted at a later stage and block 307 is not performed. Spacers are formed on the sidewalls of the various gates in block 309. In block 311, a source region and a drain region are formed. The source and drain regions are doped with the same conductivity type dopant. The method continues with block 313 in which a substrate pickup region and the counter doped region are patterned and implanted. The counter doped region implantation may be performed in addition to block 307 or instead of block 307. The method continues with block 315 in which silicide surfaces are formed for the source and drain regions, the device gate, the dummy gate, and top of the counter doped region.

FIGS. 4A, 4B, 5, 6A, 6B, 7, 8, and 9 are diagrammatic fragmentary cross-sectional side views of high voltage transistor devices at various stages of fabrication in accordance with various aspects of the present disclosure. It is understood that these figures have been simplified for a better understanding of the inventive concepts of the present disclosure. Accordingly, it should be noted that additional processes may be provided before, during, and after the processes shown in FIGS. 4A, 4B, 5, 6A, 6B, 7, 8, and 9, and that some other processes may only be briefly described herein.

Figure 4A:
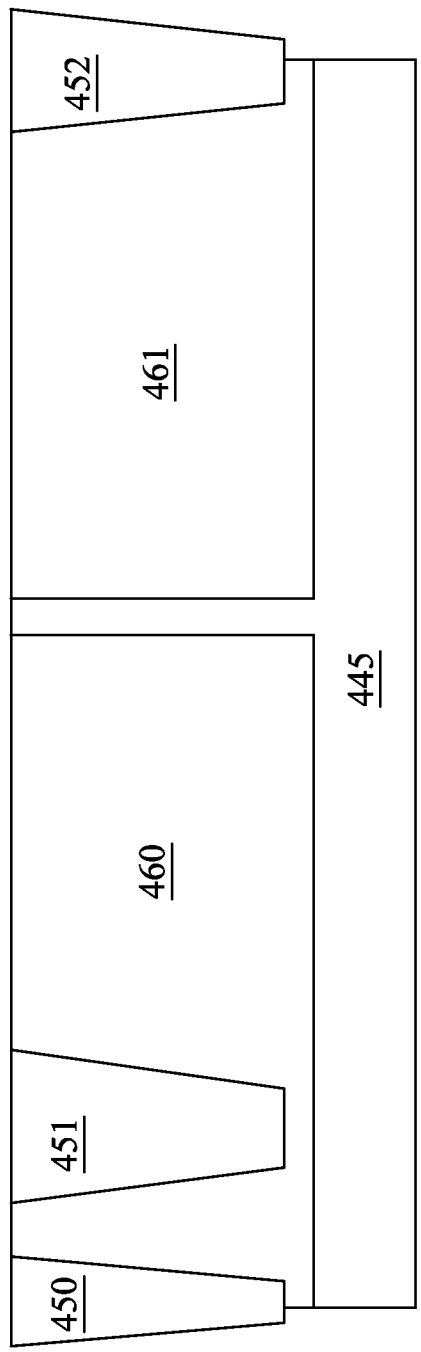
FIGS. 4A, 4B, 5, 6A, 6B, 7, 8, and 9 are diagrammatic fragmentary cross-sectional side views of a semiconductor device at various stages of fabrication in accordance with an embodiment of the present disclosure.

The high voltage semiconductor transistor device may be a high voltage N-type MOS transistor (HV NMOS) or a high voltage P-type MOS transistor (HV PMOS). The high voltage P-type transistor (HV PMOS) may be formed by reversing the appropriate conductivity types and add adding a deep n-well (DNW) below the p-well and n-well. For the sake of simplicity, the bulk of discussion below refers to the HV NMOS, and only some differences for the HV PMOS are discussed. Referring to FIG. 4A, the HV NMOS transistor includes a substrate 445. The substrate 445 is a silicon substrate that is doped with a P-type dopant such as boron.

Isolation structures 450, 451, and 452 are formed in the substrate 45. In various embodiments, the isolation structures 450, 451, and 452 are shallow trench isolation (STI) structures that each include a dielectric material. The dielectric material may be silicon oxide or silicon nitride. According to operation 301 of FIG. 3, in between the isolation structures 450 and 452, doped wells 460 and 461 are formed in the substrate 445. The doped well 460 is doped with a P-type dopant such as boron, and the doped well 461 is doped with an N-type dopant such as arsenic or phosphorous. The doped well 461 may also be referred to as an N-drift region. The STI structures may be formed before or after doping the wells 460 and 461.

Figure 4B:
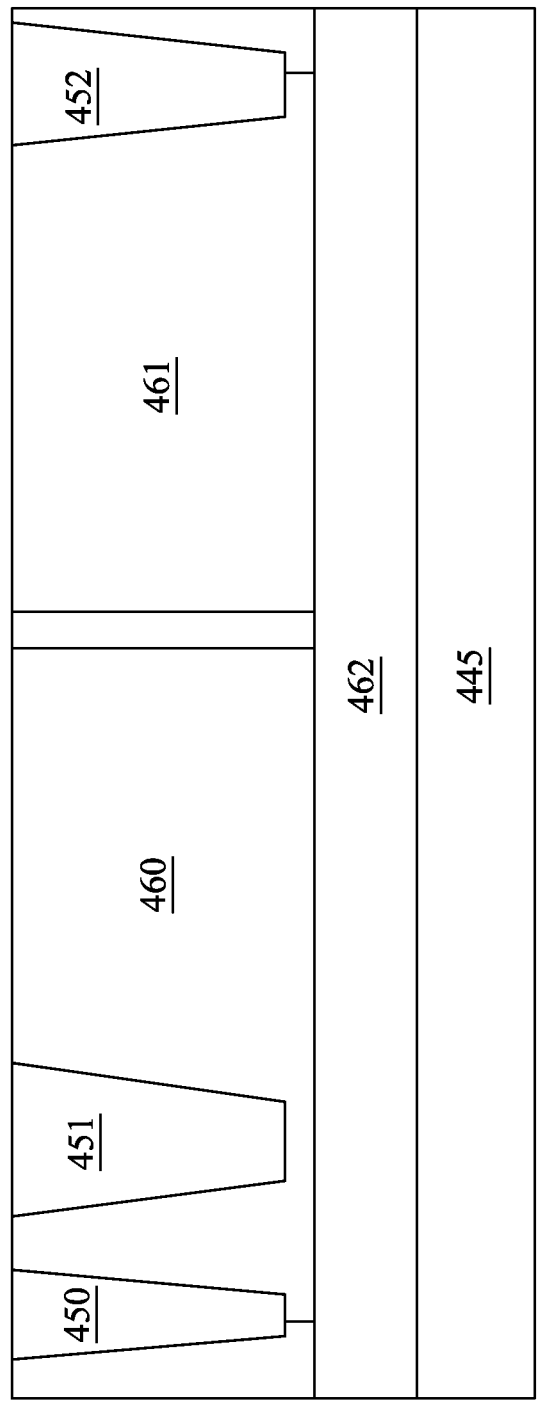

FIG. 4B shows alternative embodiments where a HV PMOS transistor is formed instead of the HV NMOS transistor, a deep N-well 462 is formed in the substrate, and the wells 460 and 461 are formed over the deep N-well but with opposite conductivity types—the well 460 would be doped with an N-type dopant, and the well 461 would be doped with a P-type dopant.

Figure 5:
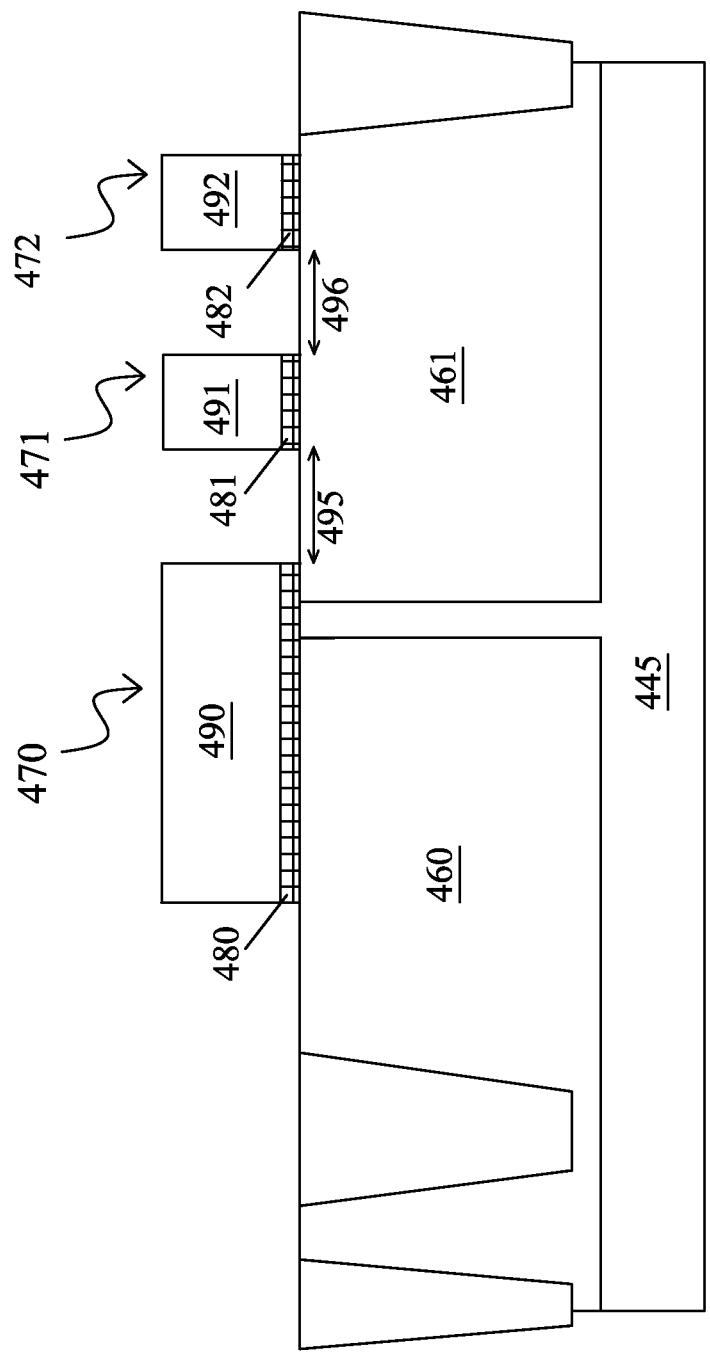

Referring to FIG. 5 and operation 303 of FIG. 3, gate stacks 470, 471, and 472 are formed over the substrate 445. The gate stacks 470, 471, and 472 include respective gate dielectric layers 480, 481, and 482. In an embodiment, the gate dielectric layers 480, 481, and 482 each include silicon oxide. The gate stacks 470, 471, and 472 also include respective gate electrode layers 490, 491, and 492 that are respectively disposed over the gate dielectric layers 480, 481, and 482. The gate electrode layers 490, 491, and 492 may each include a polysilicon material or metal or a combination of these. If a metal gate is used, then various operations of removing the polysilicon material and depositing metal layers would be performed.

As shown in FIG. 5, the gate stack 470 is formed over a portion of the doped well 460 as well as a portion of the doped well 461. The gate stacks 471 and 472 are formed over a portion of the doped well 461. The gate stacks 471 and 472 serves as dummy gates. A gap 495 is defined between the dummy gate 471 and gate 470. Another gap 496 is defined between the dummy gates 471 and 472. Each of the dummy gates 471 and 472 has a minimum length defined by the technology node for the device, but may be longer depending on the number of dummy gates and the size of the drift region. Each of the gaps 495 and 496 also have a minimum distance defined by the technology node for the device, but may be longer depending on device design. The gaps 495 and 496 may have different lengths.

Figure 6A:
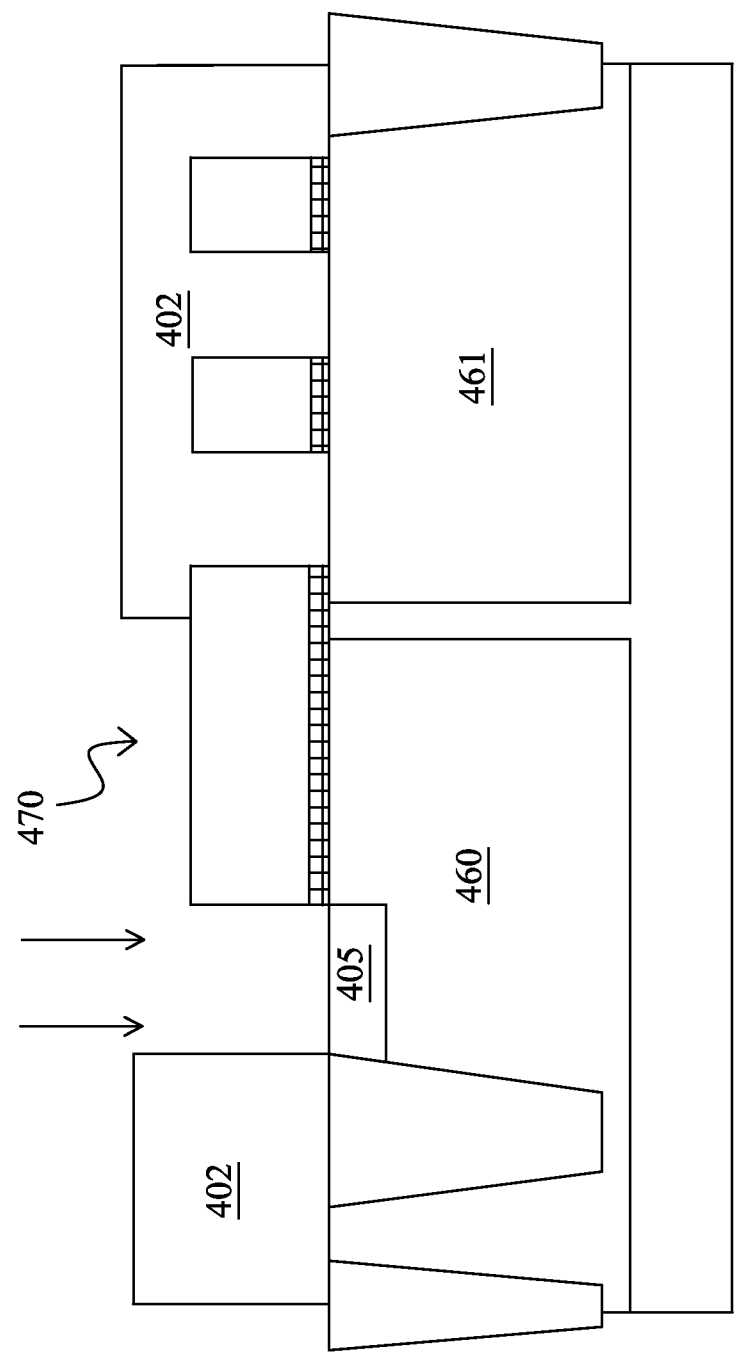

Referring now to FIG. 6A and operation 305 of FIG. 3, a photoresist mask 402 is formed to protect the doped well 461 from being implanted. The photoresist mask 402 is formed through a photolithography process, for example by forming a photoresist layer and patterning the photoresist layer into the photomask 402. An ion implantation process is thereafter performed to form a lightly doped source region 405 in the doped well 460. The gate stack 470 also serves as a protective mask during the ion implantation process and protects portions of the doped well 460 under it from being implanted. Since the present embodiment illustrates a HV NMOS device, the lightly doped source region 405 is doped with an N-type dopant such as arsenic or phosphorous. The photomask 402 is removed after implantation.

Figure 6B:
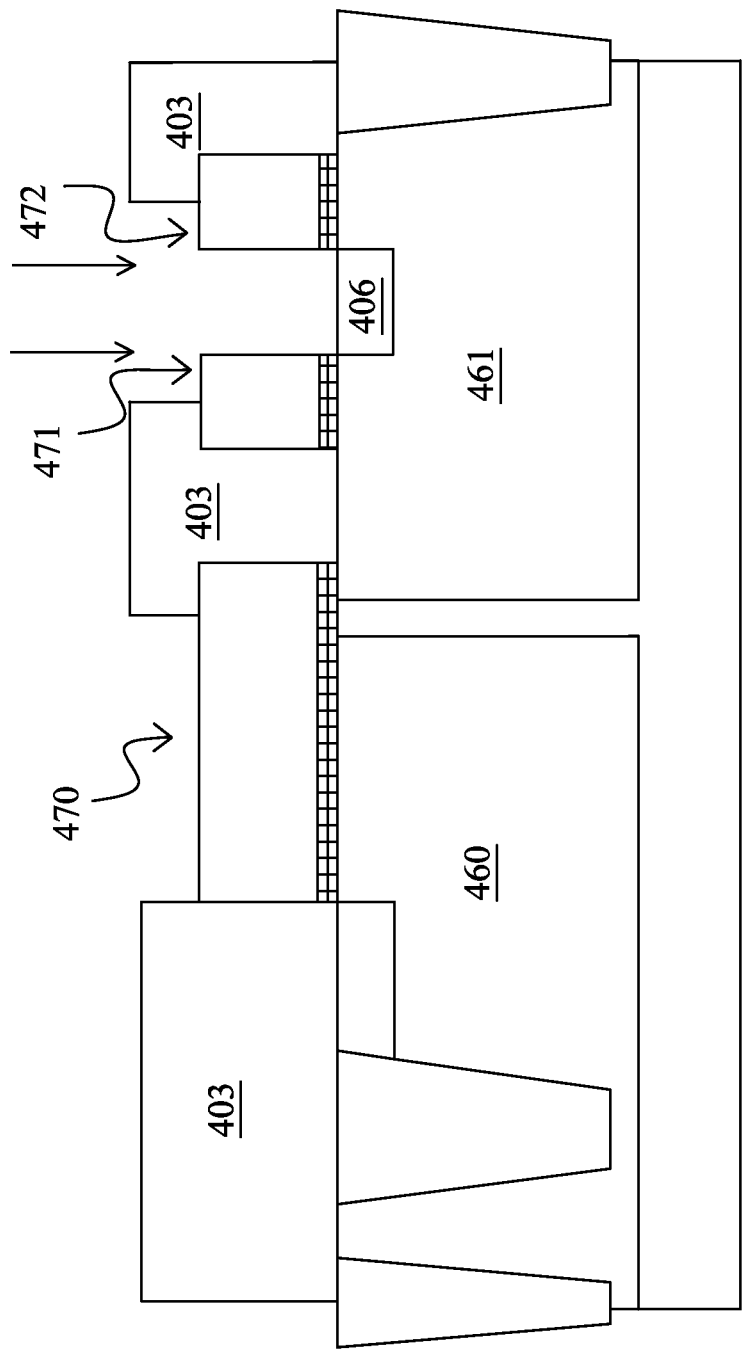

Referring now to FIG. 6B and optional operation 307 of FIG. 3, a photoresist mask 403 is formed to protect the doped well 460 from being implanted. The photoresist mask 403 is formed through a photolithography process, for example by forming a photoresist layer and patterning the photoresist layer into the photomask 403. In some embodiments, the photomask 403 may be continuous over the device gate 470. An ion implantation process is thereafter performed to form a lightly doped region 406 in the doped well 461. The lightly doped region 406 is the counter doped region described above. The gate stacks 471 and 472 also serve as a protective mask during the ion implantation process and protect portions of the doped well 461 under it from being implanted. Since the present embodiment illustrates a HV NMOS device, the counter doped region 406 is doped with a P-type dopant such as boron. In the CMOS process, the lightly doping is performed at the same time as the formation of the lightly doped source region in the complementary transistor. For the HV NMOS, this operation would be performed at the same time as the implantation of the lightly doped source region in the PMOS.

Figure 7:
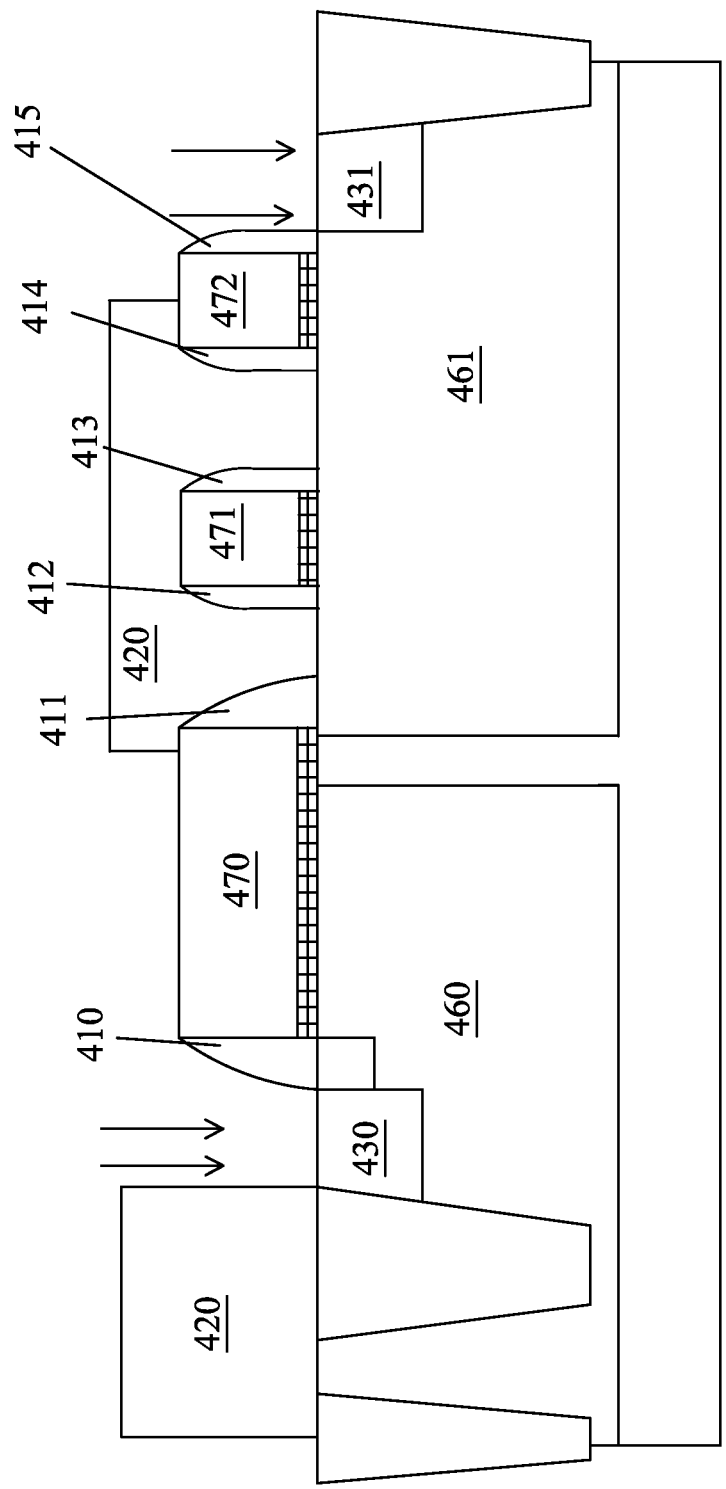

Referring now to FIG. 7 and operation 309 of FIG. 3, gate spacers 410, 411, 412, 413, 414, and 415 are then formed on sidewalls of the gate stacks 470, 471, and 472, respectively. The gate spacers 410 and 411 may also be considered to be a part of the gate stack 470; the gate spacers 412 and 413 may also be considered to be a part of the gate stack 471; and similarly for spacers 414 and 415 for gate stack 472. The gate spacers 410-415 are formed using a deposition process and an etching process (for example, an anisotropic etching process). The gate spacers 410-415 include a suitable dielectric material such as silicon nitride, silicon oxide, silicon carbide, silicon oxynitride, or combinations thereof.

Thereafter, a photoresist mask 420 is formed to cover a portion of each of the gate stacks 470, 471, and 472 in operation 311 of FIG. 3. The photoresist mask 420 is formed through a photolithography process. As is shown in FIG. 7, the photoresist mask 420 also fills the gaps between the gates. One purpose of the photoresist mask 420 is to protect regions of the doped well 461 underneath from being doped.

A heavily doped source region 430 and a heavily doped drain region 431 are formed in the doped well 460 and the doped well 461, respectively. The heavily doped source and drain regions 430 and 431 may be formed by an ion implantation process or a diffusion process. The source and drain regions 430 and 431 may also be referred to as active regions. The source and drain regions 430 and 431 are doped with dopants having the same conductivity type as the doped well 461. Thus, for a HV NMOS, the source and drain regions 430 and 431 are each doped with an N-type dopant such as arsenic or phosphorous.

Since the dopants cannot penetrate through the gate stacks 470, 471, and 472 and the spacers 110-115 around the gate stacks, the source region 430 is formed to be self-aligned with the gate spacer 410 of the gate stack 470, and the drain region 431 is formed to be self-aligned with the gate spacer 415 of the gate stack 472. In this manner, the dummy gate stack 472 helps "push" the drain region 431 away from the source region 430.

Traditional methods of forming a high voltage transistor device do not include the forming of the dummy gate stacks 471 and 472. As such, the traditional methods rely on using a photoresist mask to accurately define an area of the drain region of the high voltage transistor device. This places burdens on the photolithography process used to form the photoresist mask and may lead to undesirable results.

Here, the formation of the gate stacks 471 and 472 allow the drain region 431 to be formed in a self-aligning fashion, such that the edge of the drain region is aligned with the edge of the gate spacer 413. The photoresist mask 420 is used to protect the regions of the doped well 461 from being doped but is no longer used to define the area of the drain region 431. Consequently, the overlay requirements of the photoresist mask 420 are reduced—it can be formed to be a little bit wider or narrower, and that would not impact the area of the drain region 431, as long as the edges of photoresist mask 420 are formed to be "within" the gate stacks 470 472.

In addition, in a semiconductor fabrication process, the fabrication stage having the best overlay control is typically the stage where the gate stacks 470, 471, and 472 are formed. In various embodiments, the dummy gate stack 472 is used to define the area of the drain region 431. Since overlay control is relatively good in the fabrication stage where the dummy gate stack 471 is formed, the exact area or size of the drain region 431 can be more accurately controlled than if a photoresist mask had been used to define the area of the drain region 431.

Figure 8:
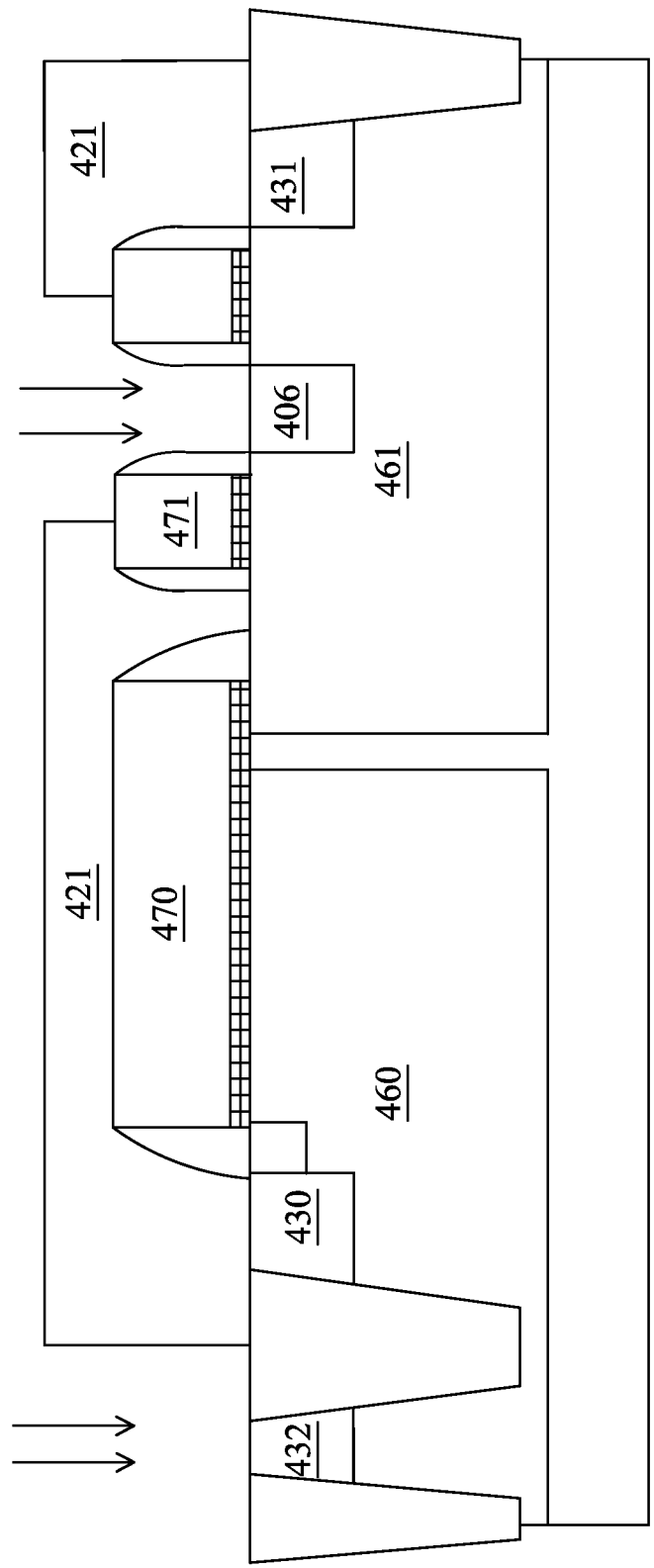

Referring now to FIG. 8 and operation 313 of FIG. 3, a substrate pickup region 432 and, in some embodiments a counter doped region 406, are implanted. A photoresist mask 421 is formed to cover a portion of each of the gate stacks 470, 471, and 472, the source region 430, and the drain region 431. The photoresist mask 421 is formed through a photolithography process. As is shown in FIG. 8, the photoresist mask 421 fills the gap between the device gate 470 and first dummy gate 471. Thus, the well region between device gate 470 and the first dummy gate 471 does not receive any dopants. The substrate pickup region is doped at a high density and in a concentration with a dopant conductivity type that is the same as that of the well 460 and opposite of the type of well 461.

According to various embodiments of the present disclosure, the counter doped region 406 may be implanted in three different ways that are all compatible with the CMOS process. The first opportunity is that of block 307 from FIG. 3, using a light doping concentration. The counter doped region 406 formed in this operation would overlap with the spacers of the dummy gates. The second opportunity is that of block 313, at the same time with the substrate pickup region and using a high doping concentration. The counter doped region 406 formed in this operation would include only areas between the spacers of the dummy gates. The third method includes both the first and second opportunities, and results in a counter doped region 406 with the highest dopant concentration.

Figure 9:
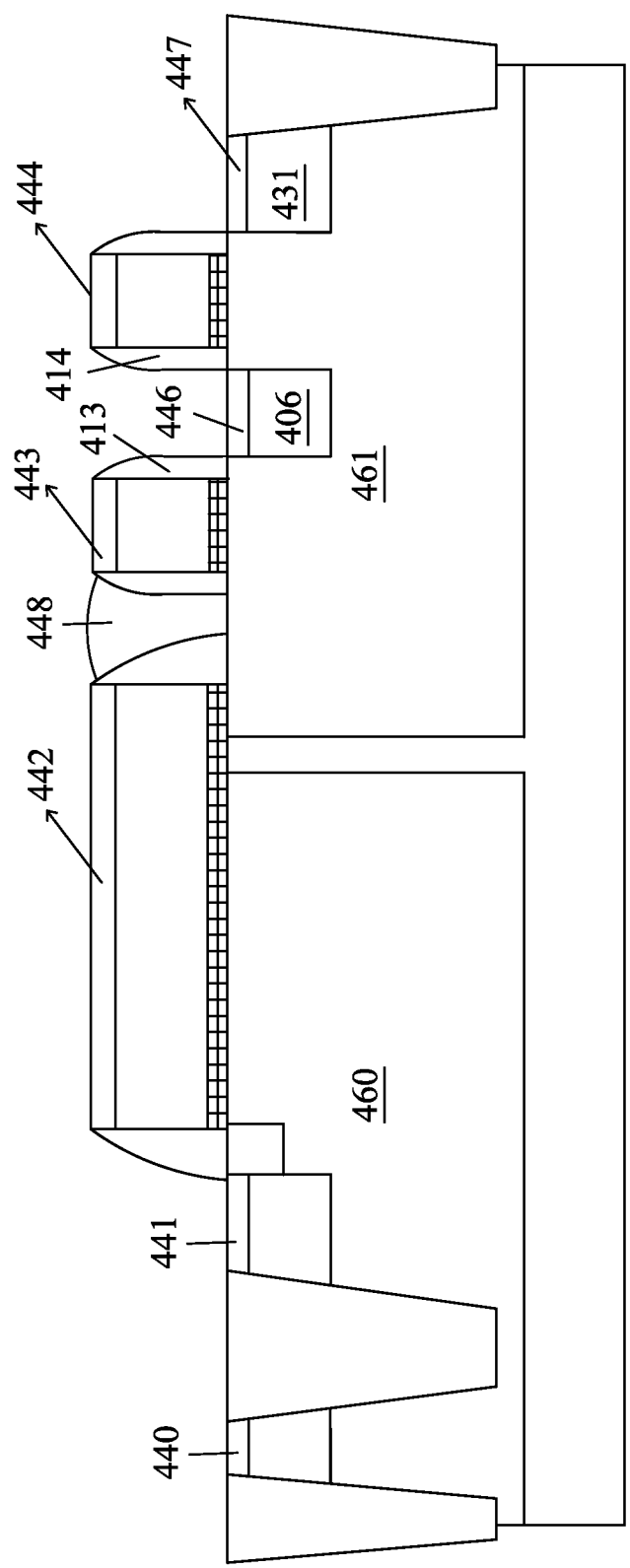

Referring now to FIG. 9 and operation 315 from FIG. 3, the photoresist mask 421 is removed in a stripping or ashing process. Thereafter, a silicidation process is performed on exposed surfaces to form self-aligned silicide (also referred to as salicide) elements 440, 441, 442, 443, 444, 446, and 447. In more detail, the silicide element 440 is formed in the exposed surface of region 432; the silicide element 441 is formed in the exposed surface of the source region 405; the silicide element 447 is formed in the exposed surface of the drain region 431; the silicide element 446 is formed in a surface the counter doped region 406 in between the gate spacers 413 and 414; and the silicide elements 442, 443, and 444 are formed in the exposed surfaces of the gate electrodes. The gate spacers serve as protective masks in the silicidation process.

A resist protection oxide (RPO) layer 448 is used to prevent the formation of silicide elements in the gap region between the first dummy gate 471 and the device gate 470. In certain embodiments, the RPO layer 448 may be made larger to include portions of the dummy gates such that no silicide forms over the dummy gates or over the counter doped region 406.

According to various embodiments, the counter doped region is sufficiently far away from the device gate. The distance between the counter doped region and the device gate is at least 0.05 microns and may be at least 0.1 microns. As disclosed, the minimum distance between them is controlled by the lithographic process of the technology node, which includes at least a feature width (one dummy gate length) and a minimum space between features (between the dummy gate and the device gate). The minimum space for the technology node also controls a minimum length of the counter doped region, which may be at least 0.05 microns and may be 0.1 microns. Of course, larger distances may be used.

Figure 10:
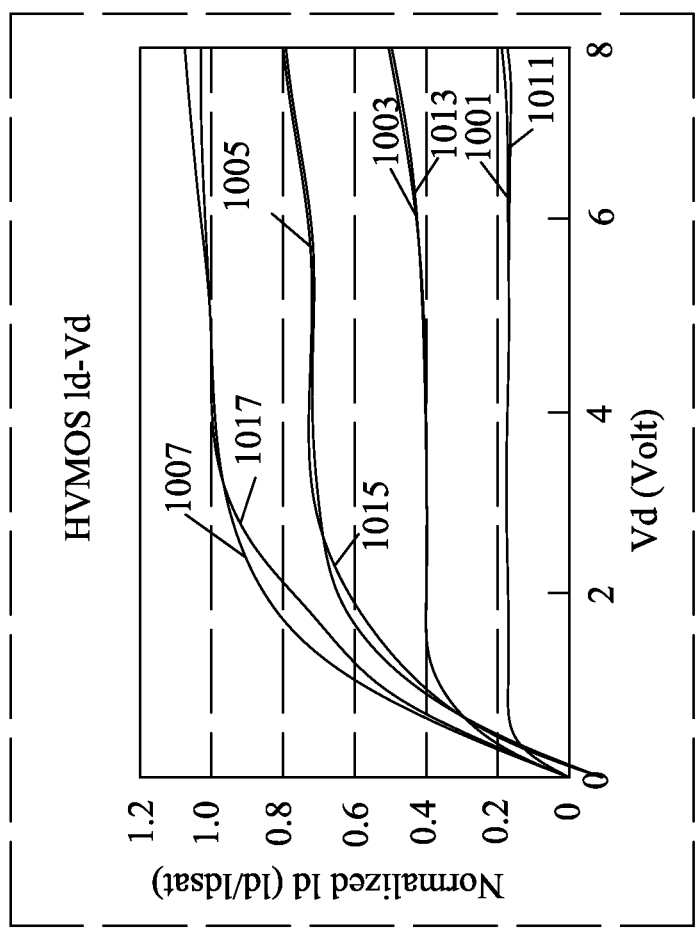
FIG. 10 is a plot of an Id-Vd curve for a comparative HV MOS transistor and a HV MOS transistor in accordance with various embodiments of the present disclosure.

FIG. 10 illustrates a theoretical $I_d$-$V_d$ curve for a conventional HV MOS such as that of FIG. 1A and a HVMOS in accordance with the present disclosure, such as that of FIG. 2. A normalized drain current over drain current at saturation (Id/Idsat) is shown on the y-axis. The x-axis shows the drain voltage. Lines 1001, 1003, 1005, 1007 corresponds to the HV MOS of the present disclosure. Lines 1011, 1013, 1015, 1017 corresponds to a conventional HV MOS of FIG. 1A. Line pairs show the behavior of the device at different gate voltages. Line pair 1001 and 1011 corresponds to the gate voltage of 1 volt. Line pair 1003 and 1013 corresponds to the gate voltage of 1.5 volts. Line pair 1005 and 1015 corresponds to the gate voltage of 2.5 volts. Line pair 1007 and 1017 corresponds to the gate voltage of 3.3 volts.

At low gate voltages of 1 volt and 1.5 volts, the line pairs effectively overlap so that there are no performance differences between these transistors. However, at higher gate voltages of 2.5 volts and 3.3 volts, an enhanced knee region appears for lines 1005 and 1007. The enhanced knee region increases the operating window for the transistor because a higher current can be achieved at a lower drain voltage. The bigger operating window can improve the device linearity and ensures that the device performs correctly.

The various embodiments of the present disclosure offer advantages, it being understood that different embodiments may offer different advantages, and that no particular advantage is required for all embodiments. One of the advantages is that the dummy gate stack(s) can effectively "push" the drain region away from the source region and the device gate. Another advantage is that the use of the dummy gate stacks relaxes the stringent overlay requirements associated with existing technologies.

It is understood that additional processes may be performed to complete the fabrication of the HV NMOS. For example, these additional processes include formation of an interconnect structure (e.g., lines and vias, metal layers, and interlayer dielectric that provide electrical interconnection to the transistors such as the HV NMOS), deposition of passivation layers, and packaging. For the sake of simplicity, these additional processes are not described herein.

More than two dummy gate structures may be used to form more than one counter doped region in the drift region. For example, three dummy gate structures can be used to form two counter doped regions. Depending on the drift region size and the minimum gate and space size, a number of the counter doped regions may fit. If more than one counter doped region is used, it is possible for them to have different dopant concentrations. For example, the counter doped region closest to the device gate may have a higher dopant concentration because it is implanted at the same time as the substrate pickup region, and the counter doped region closer to the drain region may have a lower dopant concentration because it is implanted at the same time as a lightly doped source region of the complementary transistor.

In some embodiments, the counter doped region may be subjected to additional implantation of different dopants to adjust the effective dopant concentration. For example, if an effective dopant concentration between that of the complementary lightly doped source region and that of the substrate pickup region is desired, then the counter doped region may be subjected to a counter-counter doping, for example, at the same time as the lightly doped source region. One skilled in the art may devise a number of methods to adjust an effective dopant concentration without adding additional processes to the standard CMOS manufacturing flow.

Various embodiments of the present disclosure involve a semiconductor device. The semiconductor device includes: a first doped region and a second doped region both formed in a substrate, the first and second doped regions having opposite conductivity types; a first gate formed over the substrate, the first gate overlying a portion of the first doped region and a portion of the second doped region; two or more second gates formed over the substrate, the second gates overlying a different portion of the second doped region; one or more third doped regions in the second doped region disposed only between the two or more second gates such that the third doped region and the second doped region having opposite conductivity types; a source region in the first doped region; and, a drain region in the second doped region disposed across the second gates from the first gate.

Certain embodiments of the present disclosure involve a semiconductor device. The semiconductor device includes: a first doped well and a second doped well each formed in a substrate, one of the first and second doped wells being doped with a P-type dopant, and the other one of the first and second doped wells being doped with an N-type dopant; a device gate structure disposed partially over the first and second doped wells, the device gate structure including a polysilicon gate electrode, wherein an entire upper surface of the gate electrode is silicided; and two dummy gate structures disposed over the second doped well, the two dummy gate structure being separated from the device gate structure by a gap having a minimum specified distance, wherein a counter doped region of the second doped well between the dummy gate structures is doped with a P-type dopant Still other embodiments of the present disclosure involves a method of fabricating a semiconductor device. The method includes: forming first and second wells having opposite conductivity types in a substrate; forming a device gate and two or more dummy gates over the substrate, the device gate being formed over the first and second wells, the dummy gates being formed over the second well, the first and second wells being separated by a gap; patterning and implanting a counter doped region between the dummy gates in the second well; and forming a source region and a drain region having the same type conductivity, the source region being formed in a portion of the first well not covered by the device gate, the drain region being formed in a portion of the second well adjacent to and beyond the furthest dummy gate from the device gate; and, forming silicide surfaces for the source region and the drain region The foregoing has outlined features of several embodiments so that those skilled in the art may better understand the detailed description above. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep doped well pocket for isolating the device.

What is claimed is:

1. A semiconductor device, comprising:
    a first doped region and a second doped region both formed in a substrate, the first and second doped regions having opposite conductivity types and having a native region interposing the first and second doped regions;
    a first gate formed over the substrate, the first gate overlying a portion of the first doped region, a first portion of the second doped region, and the native region;
    a second and a third gate formed over the substrate and on a first surface of the substrate, the first surface defined by the second doped region, the second and third gates overlying a second portion of the second doped region different from the first portion of the second doped region and separate from the first portion of the second doped region, wherein the second and third gates are dummy gate structures, wherein the first surface extending from a first interface with the first gate structure to a second interface with the second gate structure consists of the second doped region;
    a third doped region in the second doped region, the third doped region includes a first edge portion, a second edge portion, and a middle portion interposing the first and second edge portions, wherein:
    the middle portion has a first dopant concentration and the first and second edge portions having a second dopant concentration, the first dopant concentration greater than the second dopant concentration;
    a first edge of the middle portion of the third doped region is aligned with an edge of a first spacer element abutting the second gate and a second edge of the middle portion of the third doped region is aligned with an edge of a second spacer element abutting the third gate,
    wherein the first edge portion underlies the first spacer element and the second edge portion underlies the second spacer element and the first edge portion has an edge aligned with an edge of the second gate stack and the second edge portion has an edge aligned with an edge of the third gate stack,
    wherein the first and second edge portions and the middle portion of the third doped region each having opposite conductivity types of the second doped region, wherein the third doped surface has a silicided surface extending from the first edge to the second edge of the middle portion; and
    wherein the third doped region directly interfaces the second doped region a source region in the first doped region; and
    a drain region in the second doped region, the drain region disposed on a first side of the two or more second gates opposite a second side of the two or more second gates proximate the first gate, wherein the drain region has a first edge self-aligned with a first sidewall spacer of one of the two more second gates and a second opposing edge interfacing an isolation feature disposed in the substrate.

2. The semiconductor device of claim 1, wherein the third doped region is at least 0.05 microns from an edge of the first gate.

3. The semiconductor device of claim 1, wherein the third doped region is at least 0.15 microns from an edge of the first gate.

4. The semiconductor device of claim 1, wherein the semiconductor device is an NMOS, the first doped region has a p-type conductivity, the second doped region has an n-type conductivity, the third doped region has a p-type conductivity.

5. The semiconductor device of claim 1, further comprising a deep n-well region under the first doped region and the second doped region, wherein the semiconductor device is a PMOS, the first doped region has an n-type conductivity, the second doped region has a p-type conductivity, the third doped region has an n-type conductivity.

6. The semiconductor device of claim 1, wherein:
the source region and the drain region are heavily doped with the conductivity type of the second doped region; and
the first gate constitutes a gate of the transistor.

7. The semiconductor device of claim 1, wherein the first gate, the source region, the drain region, the second and third gates have a completely silicided upper surface.

8. The semiconductor device of claim 1, wherein the first and second gates each include a polysilicon material.

9. The semiconductor device of claim 1, where the middle portion of the third doped region is heavily doped.

10. A semiconductor device, comprising:
a first doped well and a second doped well each formed in a substrate, one of the first and second doped wells being doped with a P-type dopant, and the other one of the first and second doped wells being doped with an N-type dopant;
a native region between the first doped well and the second doped well, wherein the native region has a first interface with the first doped well and a second interface with the second doped well, the native region having a top surface contiguously extending between the first interface and the second interface, the native region top surface being substantially planar with a top surface of the first doped well;
a device gate structure disposed over a portion of the first doped well and a first portion of the second doped well, the device gate structure including a polysilicon gate electrode, wherein an entire upper surface of the gate electrode is silicided;
two dummy gate structures disposed over a second portion of the second doped well different from the first portion of the second doped well and separate from the first portion of the second doped well, the two dummy gate structures being separated from the device gate structure by a gap having a minimum specified distance;
a counter doped region in the second doped well between the dummy gate structures, the counter doped region being doped with a P-type dopant, wherein the counter doped region includes a fully silicided surface, the counter doped region comprising:
a first edge region, a second edge region and a middle region interposing the first and second edge regions, each of the first edge region, the middle edge region, and the second edge region being a continuous doped region with the P-type dopant, wherein:
the first edge region underlies a first spacer element abutting a first of the two dummy gate structures,
the middle region includes a first edge aligned with an edge of the first spacer element and a second opposing edge aligned with an edge of a second spacer element abutting a second of the two dummy gate structures, and
the second edge region underlies the second spacer element, wherein the first edge region and the second edge region include a lower concentration of the P-type dopant than the middle region; and a drain region in the second doped well, the drain region disposed on a first side of the two dummy gate structures opposite a second side of the two dummy gate structures proximate the device gate structure, and wherein the drain region is self-aligned with a first one of the two dummy gate structures and a shallow trench isolation feature, and wherein the drain region has a top surface that is coplanar with a bottom surface of two dummy gate structures.

11. The semiconductor device of claim 10, wherein:
the first doped well includes a first portion and a second portion therein that has a higher doping concentration than the first and second doped wells, the first portion serving as a source region of a transistor; and
the device gate structure serves as a gate of the transistor.

12. The semiconductor device of claim 11, wherein the first edge region and the second edge region of the counter doped region each has a lower doping concentration than the second portion.

13. The semiconductor device of claim 11, wherein the middle portion of the counter doped region has a higher doping concentration than the second portion.

14. A semiconductor device, comprising:
first and second wells having opposite conductivity types in a substrate, the first and second wells separated by a gap;
a device gate over a portion of the first well and a first portion of the second well;
two or more dummy gates over a second portion of the second well different from the first portion of the second well and separate from the first portion of the second well, wherein the device gate and the two or more dummy gates include a gate dielectric and a metal gate electrode on the gate dielectric and spacer elements abutting sidewalls of each of the gate dielectrics and metal gate electrodes;
a counter doped region between the dummy gates in the second well, the counter doped region having a silicided surface, wherein the counter doped region includes a center portion being heavily doped and two edge portions being lightly doped, wherein the two edge portions each underlie spacer elements of the two or more dummy gates;
a source region and a drain region having the same type conductivity, the source region formed in a portion of the first well not covered by the device gate, the drain region formed in a portion of the second well adjacent to and beyond a farthest dummy gate of the one or more dummy gates from the device gate, wherein an edge of the drain region is aligned with the farthest dummy gate; and
silicide surfaces over the source region and the drain region.

15. The semiconductor device of claim 14, wherein the center region of the counter doped region is disposed only between the spacers of the dummy gates, without overlapping the spacers.

16. The semiconductor device of claim 15, wherein the second two edge portions include an edge aligned with an edge of the metal gate electrode of a respective one of the two or more dummy gates.

* * * * *